United States Patent
Sun

(10) Patent No.: US 12,191,342 B2
(45) Date of Patent: Jan. 7, 2025

(54) ASYMMETRIC 8-SHAPED INDUCTOR AND CORRESPONDING SWITCHED CAPACITOR ARRAY

(71) Applicant: MEDIATEK INC., Hsin-Chu (TW)

(72) Inventor: Ruey-Bo Sun, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 501 days.

(21) Appl. No.: 17/544,883

(22) Filed: Dec. 7, 2021

(65) Prior Publication Data

US 2022/0254868 A1  Aug. 11, 2022

Related U.S. Application Data

(60) Provisional application No. 63/147,249, filed on Feb. 9, 2021.

(51) Int. Cl.
| | |
|---|---|
| *H01F 27/28* | (2006.01) |
| *H01F 27/29* | (2006.01) |
| *H01F 27/40* | (2006.01) |
| *H01G 4/40* | (2006.01) |
| *H01L 49/02* | (2006.01) |

(52) U.S. Cl.
CPC ......... *H01L 28/10* (2013.01); *H01F 27/2804* (2013.01); *H01F 27/29* (2013.01); *H01F 27/40* (2013.01); *H01G 4/40* (2013.01)

(58) Field of Classification Search
CPC .............................. H01L 28/10; H01L 23/5227
See application file for complete search history.

(56) References Cited

U.S. PATENT DOCUMENTS

| | | | |
|---|---|---|---|
| 6,429,504 B1 * | 8/2002 | Beaussart | H01L 23/5227 257/E21.022 |
| 7,088,195 B2 | 8/2006 | Muramatsu | |
| 7,705,421 B1 * | 4/2010 | Yegnashankaran | H01L 23/5227 257/E21.022 |
| 8,421,577 B2 * | 4/2013 | Tiemeijer | H01F 17/0006 336/200 |
| 8,502,596 B1 * | 8/2013 | Kaunisto | H03H 7/0153 327/557 |
| 8,531,250 B1 * | 9/2013 | Luschas | H03B 5/1228 336/200 |
| 9,214,426 B1 * | 12/2015 | Fazelpour | H01L 24/02 |
| 10,483,910 B2 | 11/2019 | Gao | |
| 10,985,724 B1 * | 4/2021 | Wang | H01F 27/2804 |
| 11,075,603 B1 * | 7/2021 | Lin | H01L 28/40 |
| 11,380,627 B1 * | 7/2022 | Chen | H01L 29/402 |

(Continued)

FOREIGN PATENT DOCUMENTS

| | | |
|---|---|---|
| CN | 103733528 A | 4/2014 |
| CN | 106030730 A | 10/2016 |
| TW | 201428783 A | 7/2014 |

*Primary Examiner* — Nathan W Ha
(74) *Attorney, Agent, or Firm* — Winston Hsu

(57) ABSTRACT

A semiconductor device includes a substrate; a first terminal and a second terminal; and a conductor arranged on the substrate between the first terminal and the second terminal to constitute an inductor shaped for forming a first loop and a second loop. A first crossing of the conductor with itself is present between the first loop and the second loop. The first loop and the second loop define a first enclosed area and a second enclosed area, respectively. The first enclosed area is smaller than the second enclosed area.

20 Claims, 6 Drawing Sheets

(56) References Cited

U.S. PATENT DOCUMENTS

| | | | |
|---|---|---|---|
| 2004/0159888 A1* | 8/2004 | Kobayashi | H01L 27/1203 257/E21.703 |
| 2004/0195652 A1* | 10/2004 | Okada | H01L 23/5227 257/E21.022 |
| 2004/0195692 A1* | 10/2004 | Adan | H01L 23/66 257/E23.114 |
| 2005/0184357 A1* | 8/2005 | Chiba | H01L 27/0641 257/E21.022 |
| 2005/0258507 A1* | 11/2005 | Tseng | H01L 27/08 257/E27.026 |
| 2006/0097346 A1* | 5/2006 | Bong | H01L 28/10 257/E21.022 |
| 2006/0151851 A1* | 7/2006 | Pillai | H01L 23/5227 257/536 |
| 2007/0045860 A1* | 3/2007 | Nakamura | H01L 21/7682 257/776 |
| 2007/0052062 A1* | 3/2007 | Ding | H01L 27/0617 257/528 |
| 2007/0052511 A1* | 3/2007 | Loke | H03B 5/124 336/200 |
| 2007/0115084 A1* | 5/2007 | Beerling | H01F 21/04 336/62 |
| 2007/0138557 A1* | 6/2007 | Ipposhi | H01L 21/84 257/E21.703 |
| 2007/0181971 A1* | 8/2007 | Park | H01L 23/5227 257/E21.022 |
| 2007/0182521 A1* | 8/2007 | Lin | H01L 23/5227 336/200 |
| 2007/0217174 A1* | 9/2007 | Shen | H01L 23/5227 361/760 |
| 2008/0001699 A1* | 1/2008 | Gardner | H01F 41/34 336/200 |
| 2008/0012091 A1* | 1/2008 | Ding | H01L 27/0641 257/E27.009 |
| 2008/0042239 A1* | 2/2008 | Lin | H01L 21/76838 257/532 |
| 2008/0042289 A1* | 2/2008 | Lin | H01L 23/5222 438/623 |
| 2008/0044977 A1* | 2/2008 | Lin | H01L 23/642 257/E21.022 |
| 2008/0070339 A1* | 3/2008 | Power | H10B 61/00 257/E27.005 |
| 2008/0096516 A1* | 4/2008 | Mun | H03F 3/68 455/341 |
| 2008/0237789 A1* | 10/2008 | He | G06F 30/36 716/132 |
| 2008/0272875 A1* | 11/2008 | Huang | H01F 17/0013 336/182 |
| 2008/0309429 A1* | 12/2008 | El Rai | H01F 17/0006 333/167 |
| 2009/0096094 A1* | 4/2009 | Tetani | H01L 23/3114 257/737 |
| 2009/0244866 A1* | 10/2009 | Kawano | H01L 27/40 336/200 |
| 2009/0261935 A1* | 10/2009 | Hisamitsu | H01F 17/0006 336/200 |
| 2011/0032067 A1 | 2/2011 | Le Guillou | |
| 2011/0063038 A1* | 3/2011 | Ainspan | H03B 5/1215 331/47 |
| 2011/0128084 A1* | 6/2011 | Jin | H03F 3/195 336/105 |
| 2011/0156205 A1* | 6/2011 | Maki | H03F 3/45188 257/532 |
| 2011/0205028 A1* | 8/2011 | Pagani | H01L 21/67115 343/866 |
| 2012/0044034 A1* | 2/2012 | Nazarian | H01L 23/5227 336/200 |
| 2012/0235275 A1* | 9/2012 | Cheng | H01L 23/5227 257/E29.325 |
| 2012/0241904 A1 | 9/2012 | Wu | |
| 2013/0141177 A1* | 6/2013 | Narathong | H01F 21/12 361/268 |
| 2014/0077919 A1* | 3/2014 | Godoy | H01F 30/08 336/226 |
| 2014/0266531 A1* | 9/2014 | Leipold | H03F 1/3241 336/170 |
| 2015/0028460 A1* | 1/2015 | Sharma | H01L 23/5283 257/664 |
| 2015/0048481 A1* | 2/2015 | Hashimoto | H01L 23/5225 257/531 |
| 2015/0084158 A1* | 3/2015 | Tsai | H03F 1/26 438/3 |
| 2015/0206934 A1* | 7/2015 | Funaya | H01L 24/06 438/3 |
| 2015/0295535 A1* | 10/2015 | Shi | H03B 5/08 29/832 |
| 2015/0349711 A1* | 12/2015 | Han | H03B 5/12 331/46 |
| 2015/0364242 A1* | 12/2015 | Aboush | H03B 5/1212 336/192 |
| 2015/0364248 A1* | 12/2015 | Groves | H01L 23/5227 336/232 |
| 2016/0035672 A1* | 2/2016 | Funaya | H01L 21/02164 438/381 |
| 2016/0197066 A1* | 7/2016 | Uchida | H01L 28/10 438/3 |
| 2016/0211220 A1* | 7/2016 | Lin | H01L 23/552 |
| 2017/0025349 A1* | 1/2017 | Wood | H01L 23/481 |
| 2017/0085228 A1* | 3/2017 | Abdo | H01L 21/565 |
| 2017/0148732 A1* | 5/2017 | Kuwajima | H01L 24/48 |
| 2017/0229393 A1* | 8/2017 | Hsieh | H01L 23/5227 |
| 2017/0236790 A1* | 8/2017 | Chinnusamy | H01L 21/4853 438/126 |
| 2017/0338788 A1* | 11/2017 | Yun | H03H 7/463 |
| 2017/0345547 A1* | 11/2017 | Armanious | H01F 17/0013 |
| 2017/0345755 A1* | 11/2017 | Uchida | H01F 41/041 |
| 2018/0131332 A1* | 5/2018 | Lo | H03F 1/565 |
| 2018/0182704 A1* | 6/2018 | Yeh | H01L 23/66 |
| 2018/0190584 A1* | 7/2018 | Upadhyaya | H01L 28/10 |
| 2018/0374794 A1* | 12/2018 | Tanaka | H01L 28/10 |
| 2019/0180916 A1* | 6/2019 | Tseng | H01L 23/645 |
| 2019/0200454 A1* | 6/2019 | Liu | H03H 7/0115 |
| 2019/0221350 A1* | 7/2019 | Yen | H01F 27/2804 |
| 2019/0229699 A1* | 7/2019 | Joshi | H01L 28/20 |
| 2019/0252117 A1* | 8/2019 | Yu | H01F 17/0006 |
| 2020/0035550 A1* | 1/2020 | Emerson | H01L 22/12 |
| 2020/0152378 A1* | 5/2020 | Yen | H01F 27/346 |
| 2020/0227203 A1* | 7/2020 | Yoon | H03H 7/0138 |
| 2020/0234864 A1 | 7/2020 | Elzinga | |
| 2020/0259455 A1* | 8/2020 | Komijani | H03B 5/1228 |
| 2020/0336160 A1 | 10/2020 | Krishnasamy Maniam | |
| 2020/0388570 A1* | 12/2020 | Johnson | H01F 27/292 |
| 2021/0074465 A1* | 3/2021 | Yen | H01L 28/10 |
| 2021/0074466 A1* | 3/2021 | Yen | H01F 17/0006 |
| 2021/0280352 A1* | 9/2021 | Küchenmeister | H01L 28/10 |
| 2021/0313269 A1* | 10/2021 | Bhagavat | H01F 17/0033 |
| 2021/0384122 A1* | 12/2021 | Leng | H01L 28/10 |
| 2023/0023018 A1* | 1/2023 | Nakashiba | H01L 23/481 |
| 2023/0065844 A1* | 3/2023 | Tang | H01L 24/08 |
| 2023/0066895 A1* | 3/2023 | Park | H01L 25/0652 |
| 2024/0014126 A1* | 1/2024 | Cheng | H01L 23/49816 |

\* cited by examiner

ASYMMETRIC 8-SHAPED INDUCTOR AND CORRESPONDING SWITCHED CAPACITOR ARRAY

CROSS REFERENCE TO RELATED APPLICATIONS

This application claims priority from U.S. provisional application No. 63/147,249 filed on Feb. 9, 2021, which is included in its entirety herein by reference.

BACKGROUND

This invention relates to integrated circuit inductors, and more particularly to an asymmetric, 8-shaped inductor capable for interference mitigation of inductor-capacitor voltage-controlled oscillators (LC-VCO) and a semiconductor device using the same.

Integrated circuit inductors are essential to realize the voltage-controlled oscillators (VCO) needed in many fully integrated transceiver chips serving a multitude of wireless communication protocols. It is known to form inductors using multiple loops, and with multiple paths per loop. The conductive track is preferably provided on two levels with cross overs between paths of the conductive track.

One approach of reducing mutual electromagnetic coupling between VCO resonators on a single semiconductor chip or die involves using inductors that are substantially symmetrical about their horizontal and/or their vertical axes and providing current to the inductors in a way so that the resulting magnetic field components tend to cancel each other by virtue of the symmetry. In addition, two such inductors may be placed near each other and oriented in a way so that the induced current in the second inductor due to the magnetic field originating from first inductor is significantly reduced. A symmetric, 8-shaped inductor is a commonly implemented method for the on-die inductor.

SUMMARY

It is one object of the present disclosure to provide an improved integrated inductor for mitigating inductor noise coupling and a device using the same.

One aspect of the invention provides a semiconductor device including a substrate; a first terminal and a second terminal; and a conductor arranged on the substrate between the first terminal and the second terminal to constitute an inductor shaped for forming a first loop and a second loop. A first crossing of the conductor with itself is present between the first loop and the second loop. The first loop and the second loop define a first enclosed area and a second enclosed area, respectively. The first enclosed area is smaller than the second enclosed area.

According to some embodiments, the first terminal and a second terminal are two terminals of a switched capacitor array (SCA).

According to some embodiments, the second loop is disposed closer to the SCA and the first loop is disposed farther away from the SCA.

According to some embodiments, the inductor is at least partially surrounded by a ground metal ring.

According to some embodiments, the ground metal ring is constructed at a top metal layer over the substrate.

According to some embodiments, the conductor is provided with a second crossing with itself between the terminals and the second loop.

According to some embodiments, the conductor is further shaped for forming a third loop and a fourth loop, wherein a third crossing of the conductor with itself is present between the third loop and the fourth loop, and wherein the third loop and the fourth loop define a third enclosed area and a fourth enclosed area, respectively, and wherein the fourth enclosed area is greater than the third enclosed area.

According to some embodiments, the conductor is further provided with a fourth crossing with itself connecting the first loop with the third loop thereby further defining the boundaries of the first enclosed area and the third enclosed area.

According to some embodiments, the first loop is connected between the fourth loop and the second loop, the fourth loop is connected between the first loop and the third loop to obtain an 8-shaped structure in series with an 8-shaped structure.

According to some embodiments, the third loop is arranged within the first loop and the fourth loop is arranged within the second loop thereby forming a fifth crossing for further defining the fourth enclosed area, and forming a sixth crossing for further defining the first and second enclosed area, to obtain an 8-within-8 shaped structure.

According to some embodiments, the inductor is part of an inductor-capacitor voltage-controlled oscillator (LC-VCO).

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

As the integration surface on silicon is getting smaller and smaller, interactions among sensitive blocks and electromagnetic (EM) sources (like VCOs) become stronger. An inductor-capacitor voltage-controlled oscillator (LC-VCO) is comprised of a negative gm cell, a switched capacitor array (SCA), an inductor, and so on. As previously mentioned, symmetric, 8-shaped inductors are typically used in the inductor-capacitor voltage-controlled oscillator. However, the noise coupling has become an issue for such symmetric, 8-shaped inductor, especially when an adjacent ground top metal is present.

The present disclosure provides a semiconductor device comprising an asymmetric, 8-shaped inductor for on-die inductor coupling mitigation in order to address this problem. A better electrical performance can be obtained in a case that the inductor according to the present disclosure is used in, for example a voltage-controlled oscillator. According to the experimental results, a 20 dB coupled noise reduction can be observed at the inductor of a victim circuit.

Figure 1:
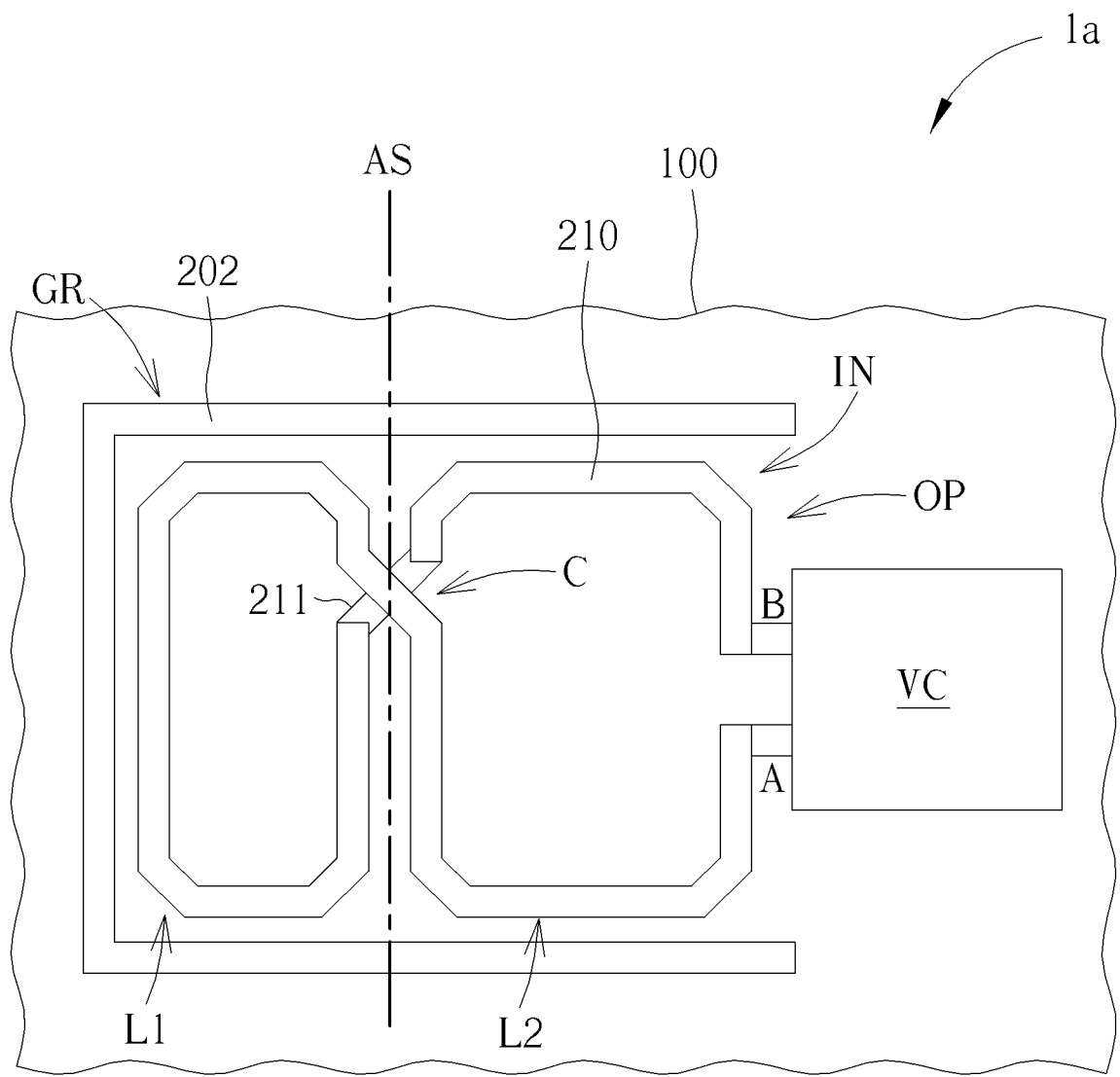
FIG. 1 shows an asymmetric, 8-shaped inductor in accordance with an embodiment of the invention.

FIG. 1 shows an asymmetric, 8-shaped inductor in accordance with an embodiment of the invention. As shown in FIG. 1, a semiconductor device 1a comprises a substrate 100 such as a silicon-based substrate and an inductor IN fabricated on the substrate 100. According to an embodiment, the inductor IN is at least partially surrounded by a ground metal ring GR. According to an embodiment, for example, the ground metal ring GR is constructed at top metal layers 202 over the substrate 100. The top metal layer mentioned herein is not limited to the topmost metal layer. For example, the top metal layers may comprise the topmost metal layer and several upper metal layers below the topmost metal layer. It is to be understood that the ground metal ring GR may be defined in any of the top metal layers.

According to an embodiment, for example, the top metal layer 202 may be an aluminum layer, but is not limited thereto. The inductor IN is formed by using a conductor 210 that is arranged between two terminals A, B of a victim circuit VC that is disposed adjacent to an opened end OP of the ground metal ring GR. Although an open-loop type ground ring GR is illustrated, it is to be understood that in some embodiments the ground metal ring GR may be a close-loop type ground ring. According to an embodiment, for example, the victim circuit VC may be a switched capacitor array of an inductor-capacitor voltage-controlled oscillator, but is not limited thereto.

According to an embodiment, the conductor 210 is shaped for forming a first loop L1 and a second loop L2 of the single-turn inductor IN. A crossing C is present between the first loop L1 and the second loop L2. The first loop L1 encloses a first area and the second loop L2 encloses a second area. The first loop L1 is defined by the conductor 210 and the crossing C, which makes the first enclosed area, at least in projection in a direction perpendicular to the plane in which the first loop is arranged, fully enclosed. The second loop L2 is defined by the conductor 210 and the crossing C. According to an embodiment, the second enclosed area is not fully enclosed.

According to an embodiment, the first loop L1 is asymmetric to the second loop L2 with respect to the axis AS. According to an embodiment, the first enclosed area is smaller than the second enclosed area. According to an embodiment, the second loop L2 is disposed closer to the victim circuit VC and the first loop L1 is disposed farther away from the victim circuit VC.

The inductor IN may be fabricated on the substrate 100 by conventional semiconductor fabrication processes including but not limited to deposition, lithography, etching, cleaning, polishing, annealing or the like. The inductor IN may be composed of at least two interconnect layers. Generally, the thicker top interconnect layer has lower resistance and the inductor IN is generally laid out in the top metal layers, except for the locations where the conductor 210 crosses itself. At those crossings the lower interconnect layer is used. For example, in FIG. 1, the conductor 210 may be located in the top metal layers and connected to an underlying interconnect layer 211 at the crossing C1. The interconnect layer 211 may be located in the lower metal layer.

Figure 2:
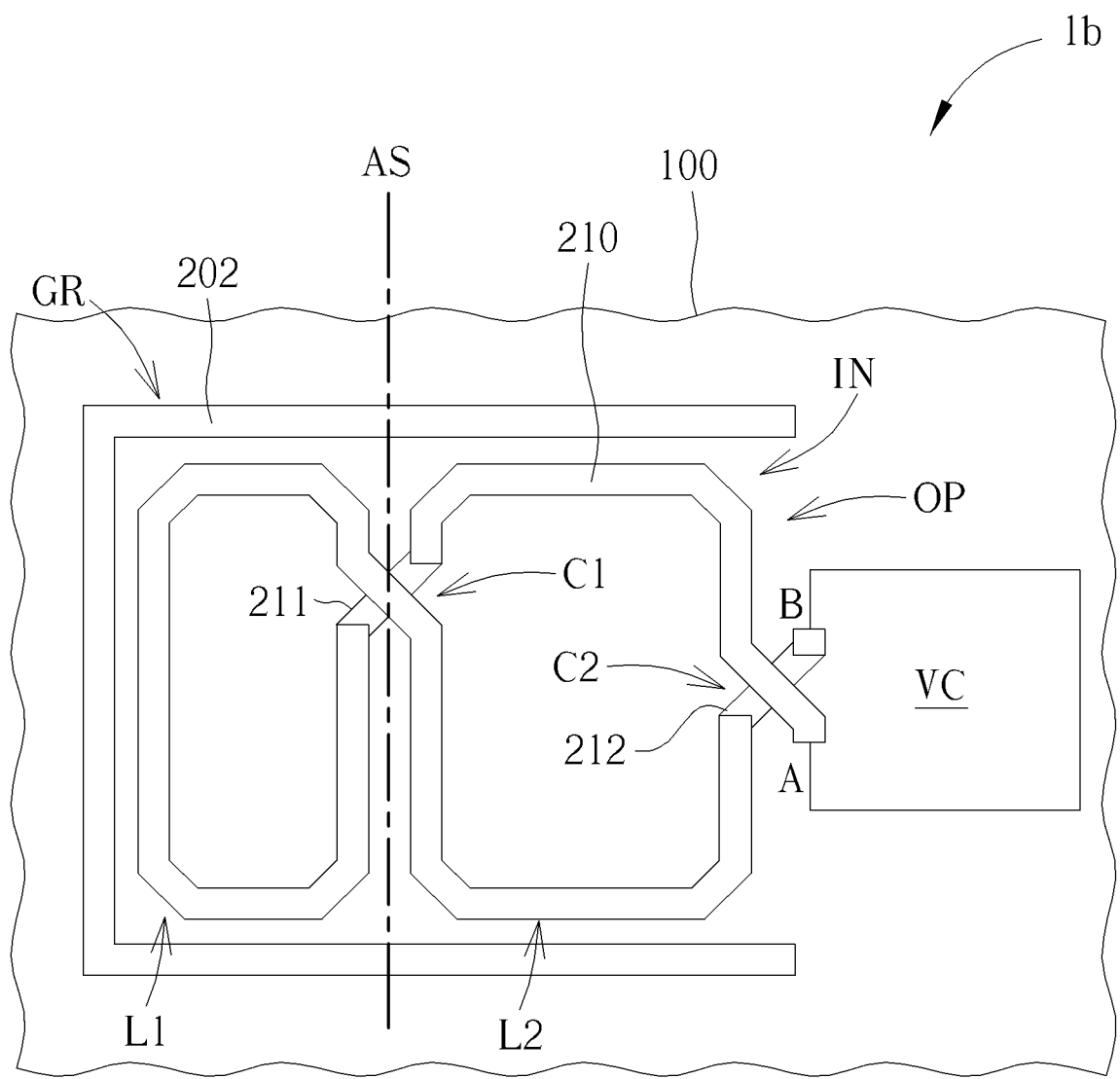
FIG. 2 shows an asymmetric, 8-shaped inductor in accordance with another embodiment of the invention.

FIG. 2 shows an asymmetric, 8-shaped inductor in accordance with another embodiment of the invention, wherein like regions, layers or elements are designated by like numeral numbers or labels. As shown in FIG. 2, likewise, the single-turn, 8-shaped inductor 1b comprises a substrate 100 such as a silicon-based substrate and an inductor IN fabricated on the substrate 100. According to an embodiment, the inductor IN is at least partially surrounded by a ground metal ring GR. According to an embodiment, for example, the ground metal ring GR is constructed at a top metal layer 202 over the substrate 100. According to an embodiment, for example, the top metal layer 202 may be an aluminum layer, but is not limited thereto. The inductor IN is formed by using a conductor 210 that is arranged between two terminals A, B of a victim circuit VC that is disposed adjacent to an opened end OP of the ground metal ring GR. According to an embodiment, for example, the victim circuit VC may be a switched capacitor array of an inductor-capacitor voltage-controlled oscillator, but is not limited thereto.

According to an embodiment, the conductor 210 is shaped for forming a first loop L1 and a second loop L2 of the single-turn inductor IN. A first crossing C1 is present between the first loop L1 and the second loop L2. The first loop L1 encloses a first area and the second loop L2 encloses a second area. The first loop L1 is defined by the conductor 210 and the first crossing C1, which makes the first enclosed area. The second loop L2 is defined by the conductor 210, the first crossing C1, and a second crossing C2 in between the second loop L2 and the terminals A, B. According to an embodiment, the first loop L1 is asymmetric to the second loop L2 with respect to the axis AS. According to an embodiment, the first enclosed area is smaller than the second enclosed area. According to an embodiment, the second loop L2 is disposed closer to the victim circuit VC and the first loop L1 is disposed farther away from the victim circuit VC.

The inductor IN may be fabricated on the substrate 100 by conventional semiconductor fabrication processes including but not limited to deposition, lithography, etching, cleaning, polishing, annealing or the like. The inductor IN may be composed of at least two interconnect layers. Generally, the thicker top interconnect layer has lower resistance and the inductor IN is generally laid out in the top metal layers, except for the locations where the conductor 210 crosses itself. At those crossings the lower interconnect layer is used. For example, in FIG. 2, the conductor 210 may be located in the top metal layers and connected to underlying interconnect layers 211, 212 at the crossings C1, C2, respectively. The interconnect layers 211, 212 may be located in the metal layer below the top metal layers.

Figure 3:
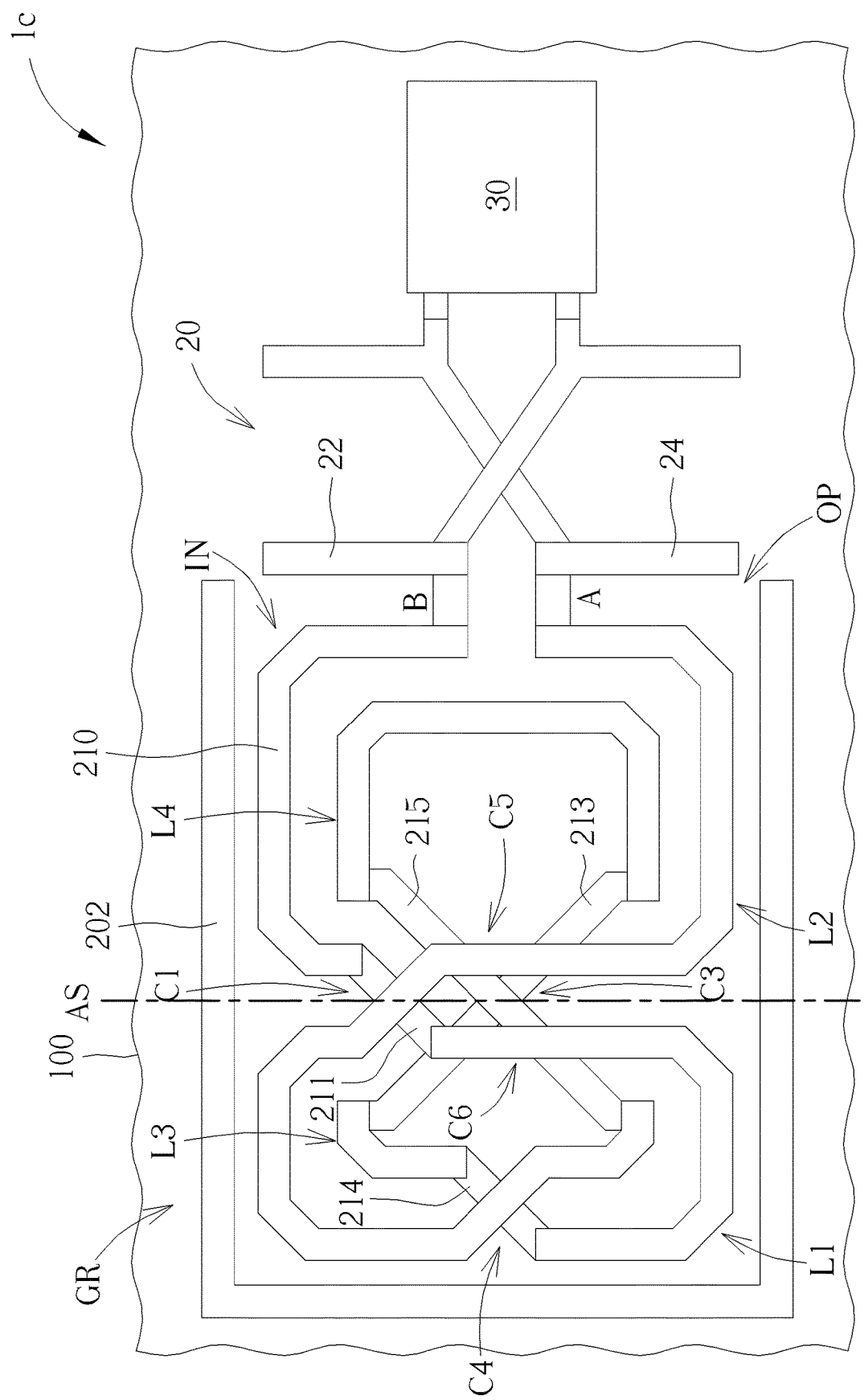
FIG. 3 shows an asymmetric, 8-shaped inductor in accordance with another embodiment of the invention.

FIG. 3 shows an asymmetric, 8-shaped inductor in accordance with another embodiment of the invention, wherein like regions, layers or elements are designated by like numeral numbers or labels. As shown in FIG. 3, the semiconductor device 1c comprises a substrate 100 such as a silicon-based substrate and a double-turn, 8-shaped inductor IN fabricated on the substrate 100. It is understood that the present invention is applicable to multiple turn inductors, not limited to a double-turn inductor. According to an embodiment, the inductor IN is at least partially surrounded by a ground metal ring GR. According to an embodiment, for example, the ground metal ring GR is constructed at a top metal layer 202 over the substrate 100. According to an embodiment, for example, the top metal layer 202 may be an aluminum layer, but is not limited thereto. The inductor IN is formed by using a conductor 210 that is arranged between two terminals A, B of a switched capacitor array 20 that is disposed adjacent to an opened end OP of the ground metal ring GR. According to an embodiment, for example, the switched capacitor array 20 may be electrically connected to a negative gm cell 30. It is understood that the arrangement of the inductor IN, switched capacitor array 20 and the negative gm cell 30 is for illustration purposes only.

According to an embodiment, the conductor 210 is shaped for forming a first loop L1 and a second loop L2 of the inductor IN. A first crossing C1 is present between the first loop L1 and the second loop L2. The first loop L1 encloses a first area and the second loop L2 encloses a second area. The first loop L1 is generally defined by the conductor 210 and the first crossing C1, which makes the first enclosed area. The second loop L2 is generally defined by the conductor 210, the first crossing C1, and the terminals A, B. According to an embodiment, the first loop L1 is asymmetric to the second loop L2 with respect to the axis AS. According to an embodiment, the first enclosed area is smaller than the second enclosed area. According to an embodiment, the second loop L2 is disposed closer to the switched capacitor array 20 and the first loop L1 is disposed farther away from the switched capacitor array 20.

According to an embodiment, the conductor 210 is further shaped for forming a third loop L3 and a fourth loop L4. According to an embodiment, a third crossing C3 of the conductor 210 with itself is present between the third loop L3 and the fourth loop L4. According to an embodiment, the third loop L3 and the fourth loop L4 define a third enclosed area and a fourth enclosed area, respectively. According to an embodiment, the fourth enclosed area is greater than the third enclosed area.

According to an embodiment, the conductor 210 is further provided with a fourth crossing C4 with itself connecting the first loop L1 with the third loop L3 thereby further defining the boundaries of the first enclosed area and the third enclosed area.

According to an embodiment, the first loop L1 is connected between the fourth loop L4 and the second loop L2. According to an embodiment, the fourth loop L4 is connected between the first loop L1 and the third loop L3 to obtain an 8-shaped structure in series with an 8-shaped structure.

According to an embodiment, the third loop L3 is arranged within the first loop L1 and the fourth loop L4 is arranged within the second loop L2 thereby forming a fifth crossing C5 for further defining the fourth enclosed area, and forming a sixth crossing C6 for further defining the first and second enclosed area, to obtain an 8-within-8 shaped structure.

The inductor IN may be fabricated on the substrate 100 by conventional semiconductor fabrication processes including but not limited to deposition, lithography, etching, cleaning, polishing, annealing or the like. The inductor IN may be composed of at least two interconnect layers. Generally, the thicker top interconnect layer has lower resistance and the inductor IN is generally laid out in the top metal layers, except for the locations where the conductor 210 crosses itself. At those crossings the lower interconnect layer is used. For example, in FIG. 3, the conductor 210 may be patterned in the top metal layers and connected to underlying interconnect layers 211, 213, 214, 215 at the crossings C1, C3, C4, C5-C6, respectively. The interconnect layers 211, 214, and 215 may be located in the lower metal layer just below the top metal layers. The interconnect layer 213 may be located in the metal layer below the interconnect layers 211, 214, and 215.

Figure 4:
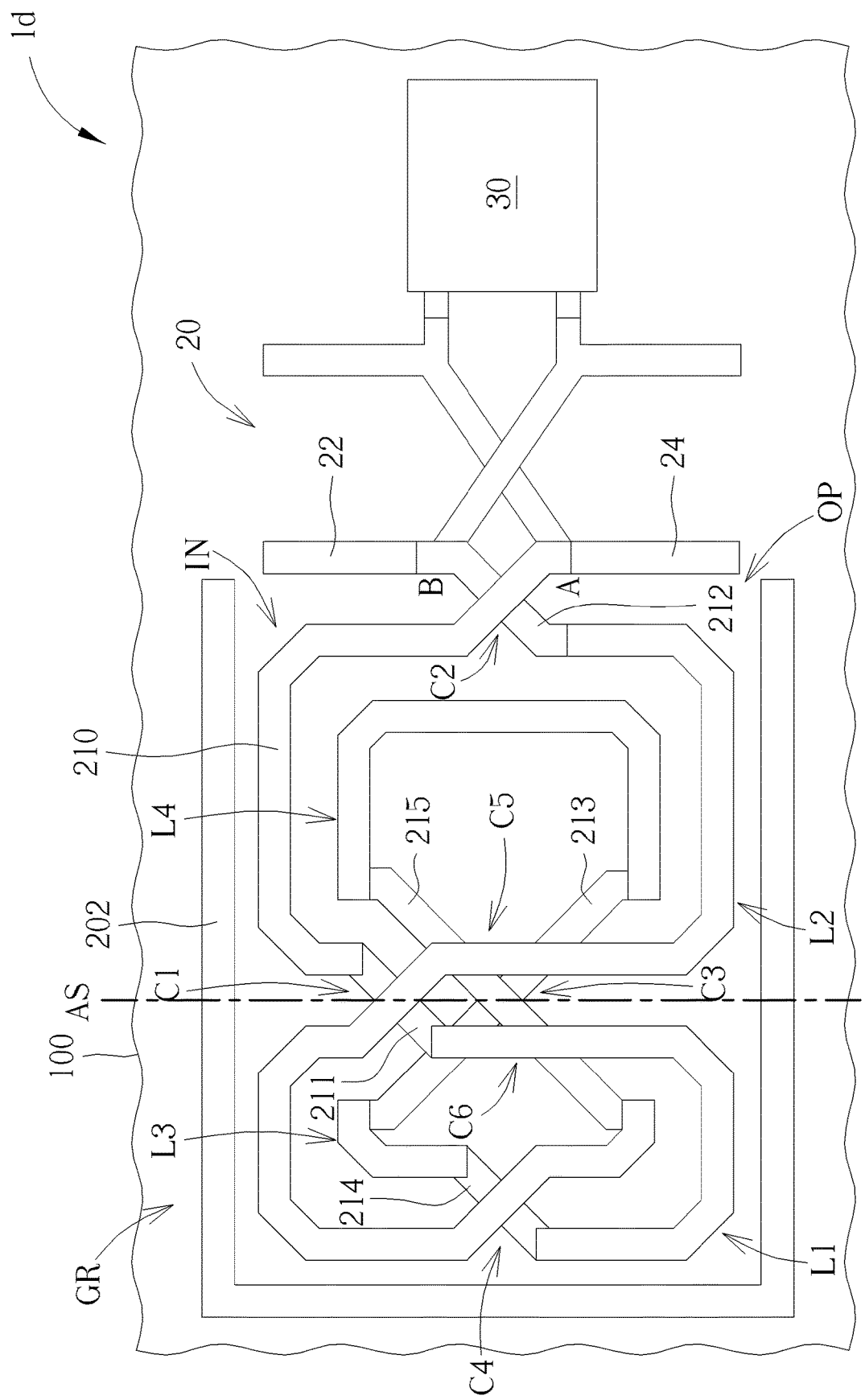
FIG. 4 shows an asymmetric, 8-shaped inductor in accordance with still another embodiment of the invention.

FIG. 4 shows an asymmetric, 8-shaped inductor in accordance with another embodiment of the invention, wherein like regions, layers or elements are designated by like numeral numbers or labels. As shown in FIG. 4, the device 1d comprises a substrate 100 such as a silicon-based substrate and a double-turn, 8-shaped inductor IN fabricated on the substrate 100. It is understood that the present invention is applicable to multiple turn inductors, not limited to a double-turn inductor. According to an embodiment, the inductor IN is at least partially surrounded by a ground metal ring GR. According to an embodiment, for example, the ground metal ring GR is constructed at a top metal layer 202 over the substrate 100. According to an embodiment, for example, the top metal layer 202 may be an aluminum layer, but is not limited thereto. The inductor IN is formed by using a conductor 210 that is arranged between two terminals A, B of a switched capacitor array 20 that is disposed adjacent to an opened end OP of the ground metal ring GR. According to an embodiment, for example, the switched capacitor array 20 may be electrically connected to a negative gm cell 30. It is understood that the arrangement of the inductor IN, switched capacitor array 20 and the negative gm cell 30 is for illustration purposes only.

According to an embodiment, the conductor 210 is shaped for forming a first loop L1 and a second loop L2 of the inductor IN. A first crossing C1 is present between the first loop L1 and the second loop L2. The first loop L1 encloses a first area and the second loop L2 encloses a second area. The first loop L1 is generally defined by the conductor 210 and the first crossing C1, which makes the first enclosed area. The second loop L2 is generally defined by the conductor 210, the first crossing C1, and a second crossing C2 in between the second loop L2 and the terminals A, B. According to an embodiment, the first loop L1 is asymmetric to the second loop L2 with respect to the axis AS. According to an embodiment, the first enclosed area is smaller than the second enclosed area. According to an embodiment, the second loop L2 is disposed closer to the switched capacitor array 20 and the first loop L1 is disposed farther away from the switched capacitor array 20.

According to an embodiment, the conductor 210 is further shaped for forming a third loop L3 and a fourth loop L4. According to an embodiment, a third crossing C3 of the conductor 210 with itself is present between the third loop L3 and the fourth loop L4. According to an embodiment, the third loop L3 and the fourth loop L4 define a third enclosed area and a fourth enclosed area, respectively. According to an embodiment, the fourth enclosed area is greater than the third enclosed area.

According to an embodiment, the conductor 210 is further provided with a fourth crossing C4 with itself connecting the first loop L1 with the third loop L3 thereby further defining the boundaries of the first enclosed area and the third enclosed area.

According to an embodiment, the first loop L1 is connected between the fourth loop L4 and the second loop L2. According to an embodiment, the fourth loop L4 is connected between the first loop L1 and the third loop L3 to obtain an 8-shaped structure in series with an 8-shaped structure.

According to an embodiment, the third loop L3 is arranged within the first loop L1 and the fourth loop L4 is arranged within the second loop L2 thereby forming a fifth crossing C5 for further defining the fourth enclosed area, and forming a sixth crossing C6 for further defining the first and second enclosed area, to obtain an 8-within-8 shaped structure.

The inductor IN may be fabricated on the substrate 100 by conventional semiconductor fabrication processes including but not limited to deposition, lithography, etching, cleaning, polishing, annealing or the like. The inductor IN may be composed of at least two interconnect layers. Generally, the thicker top interconnect layer has lower resistance and the inductor IN is generally laid out in the top meal layers, except for the locations where the conductor 210 crosses itself. At those crossings the lower interconnect layer is used. For example, in FIG. 4, the conductor 210 may be patterned in the top metal layers and connected to underlying interconnect layers 211, 212, 213, 214, 215 at the crossings C1, C2, C3, C4, C5-C6, respectively. The interconnect layers 211, 212, 214, and 215 may be located in the lower metal layer just below the top metal layers. The interconnect layer 213 may be located in the metal layer below the interconnect layers 211, 212, 214, and 215.

Figure 5:
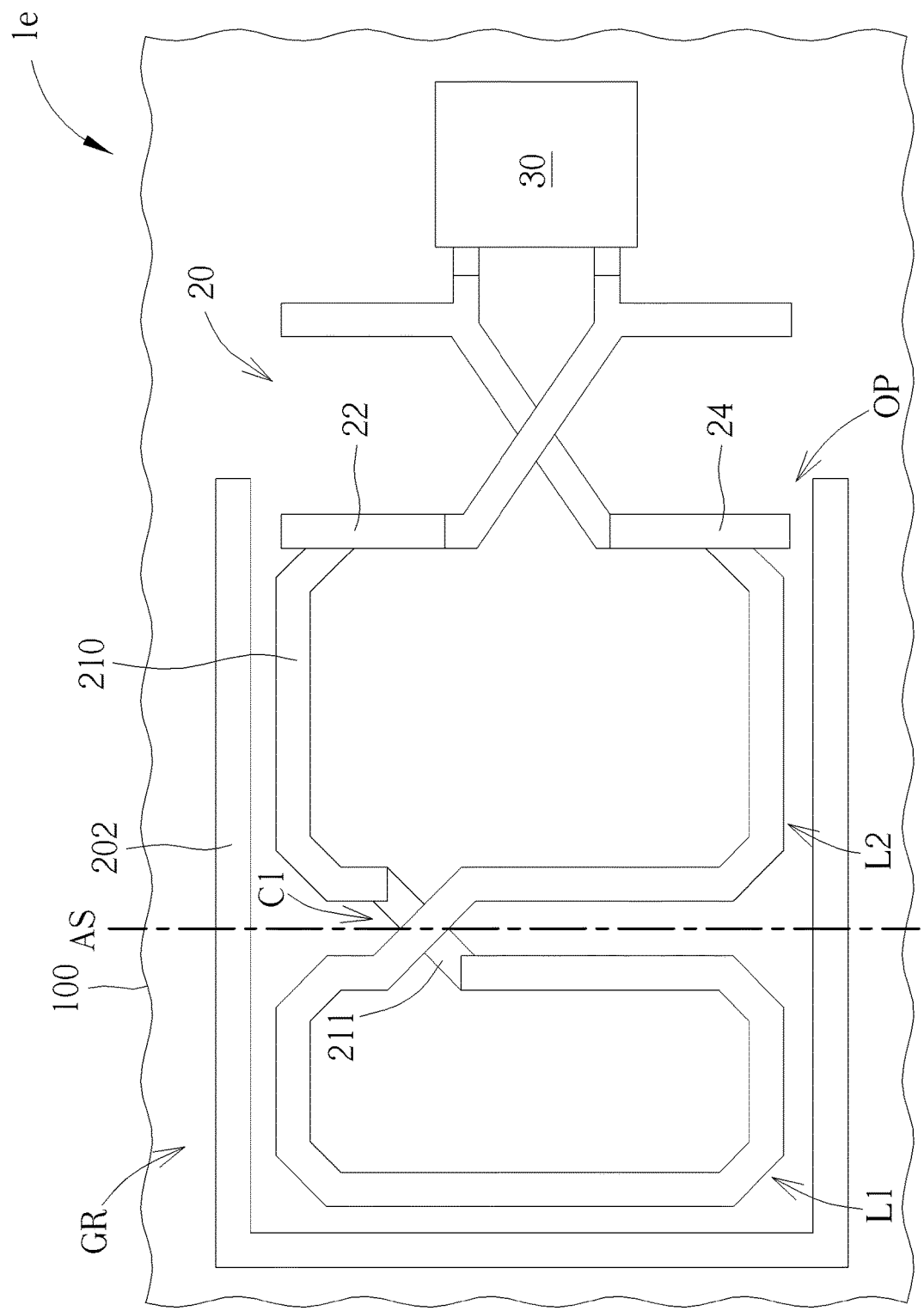
FIG. 5 shows an asymmetric, 8-shaped inductor in accordance with still another embodiment of the invention.

FIG. 5 shows an asymmetric, 8-shaped inductor in accordance with still another embodiment of the invention, wherein like regions, layers or elements are designated by like numeral numbers or labels. As shown in FIG. 5, the device 1e comprises a substrate 100 such as a silicon-based substrate and a single-turn, 8-shaped inductor IN fabricated on the substrate 100. It is understood that the present invention is applicable to multiple turn inductors, not limited to a double-turn inductor. According to an embodiment, the inductor IN is at least partially surrounded by a ground metal ring GR. According to an embodiment, for example, the ground metal ring GR is constructed at a top metal layer 202 over the substrate 100. According to an embodiment, for example, the top metal layer 202 may be an aluminum layer, but is not limited thereto. The inductor IN is formed by using a conductor 210 that is merged with connecting parts 22, 24 of a switched capacitor array 20 that is disposed adjacent to an opened end OP of the ground metal ring GR. According to an embodiment, for example, the switched capacitor array 20 may be electrically connected to a negative gm cell 30. It is understood that the arrangement of the inductor IN, switched capacitor array 20 and the negative gm cell 30 is for illustration purposes only.

It is beneficial to cancel the terminals A, B in FIG. 3 because the metal connection between the switched capacitor array 20 and the inductor IN may induce an additional current loop and thus degrade an aggressor to the inductor coupling. By merging the inductor IN with the connecting parts 22, 24 of the switched capacitor array 20, the undesired current loop can be avoided.

According to an embodiment, likewise, the conductor 210 is shaped for forming a first loop L1 and a second loop L2 of the inductor IN. A first crossing C1 is present between the first loop L1 and the second loop L2. The first loop L1 encloses a first area and the second loop L2 encloses a second area. The first loop L1 is generally defined by the conductor 210 and the first crossing C1, which makes the first enclosed area. The second loop L2 is generally defined by the conductor 210, the first crossing C1, and the connecting parts 22, 24 of the switched capacitor array 20. According to an embodiment, the first loop L1 is asymmetric to the second loop L2 with respect to the axis AS. According to an embodiment, the first enclosed area is smaller than the second enclosed area. According to an embodiment, the second loop L2 is disposed closer to the switched capacitor array 20 and the first loop L1 is disposed farther away from the switched capacitor array 20.

The inductor IN may be fabricated on the substrate 100 by conventional semiconductor fabrication processes including but not limited to deposition, lithography, etching, cleaning, polishing, annealing or the like. The inductor IN may be composed of at least two interconnect layers. Generally, the thicker top interconnect layer has lower resistance and the inductor IN is generally laid out in the top metal layers, except for the locations where the conductor 210 crosses itself. At those crossings the lower interconnect layer is used. For example, in FIG. 5, the conductor 210 may be patterned in the top metal layers and connected to an underlying interconnect layer 211 at the crossing C1.

Figure 6:
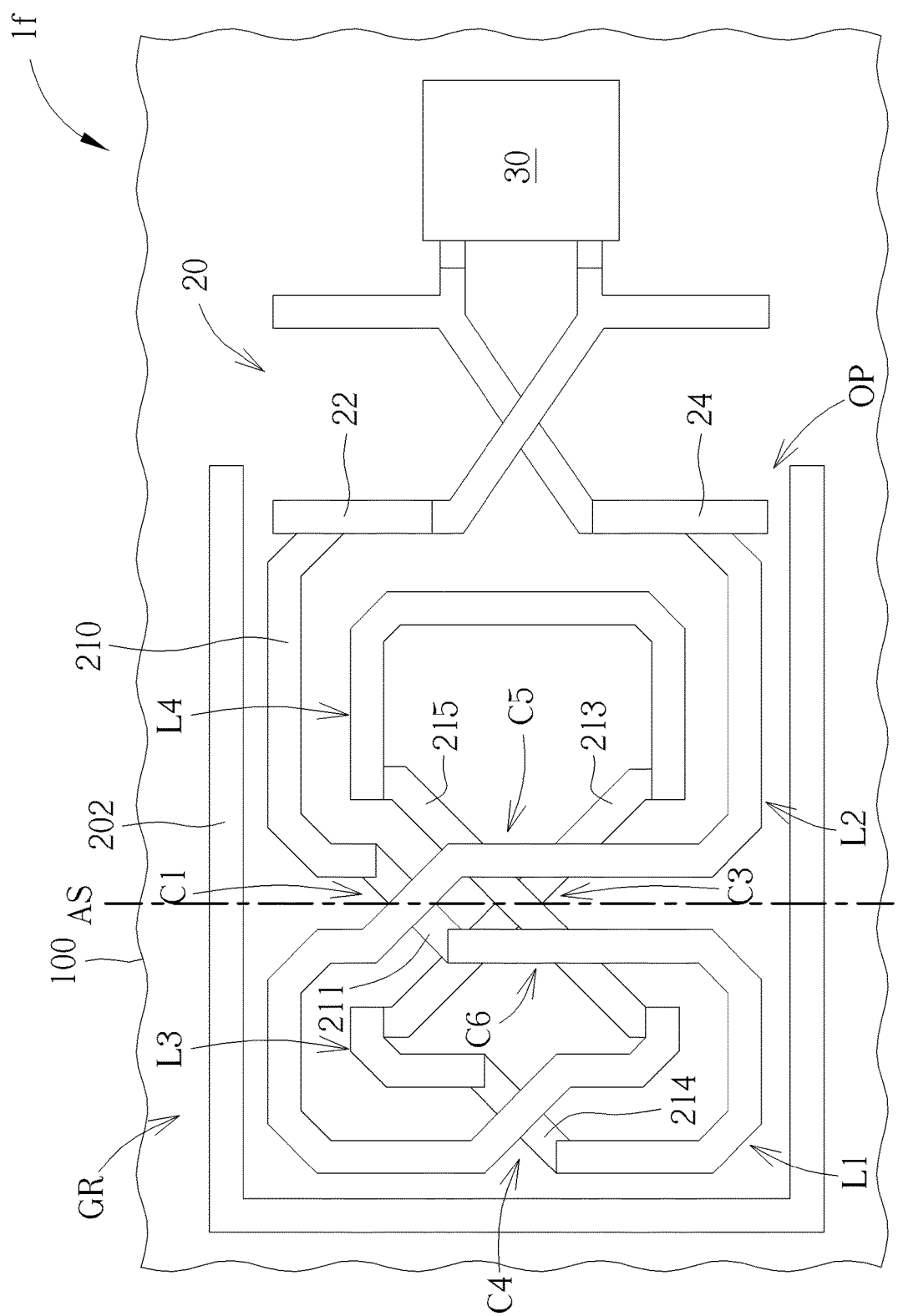
FIG. 6 shows an asymmetric, 8-shaped inductor in accordance with still another embodiment of the invention.

FIG. 6 shows an asymmetric, 8-shaped inductor in accordance with still another embodiment of the invention, wherein like regions, layers or elements are designated by like numeral numbers or labels. As shown in FIG. 6, the device 1f comprises a substrate 100 such as a silicon-based substrate and a double-turn, 8-shaped inductor IN fabricated on the substrate 100. It is understood that the present invention is applicable to multiple turn inductors, not limited to a double-turn inductor. According to an embodiment, the inductor IN is at least partially surrounded by a ground metal ring GR. According to an embodiment, for example, the ground metal ring GR is constructed at a top metal layer 202 over the substrate 100. According to an embodiment, for example, the top metal layer 202 may be an aluminum layer, but is not limited thereto. The inductor IN is formed by using a conductor 210 that is merged with connecting parts 22, 24 of a switched capacitor array 20 that is disposed adjacent to an opened end OP of the ground metal ring GR. According to an embodiment, for example, the switched capacitor array 20 may be electrically connected to a negative gm cell 30. It is understood that the arrangement of the inductor IN, switched capacitor array 20 and the negative gm cell 30 is for illustration purposes only.

It is beneficial to cancel the terminals A, B as depicted in FIG. 3 because the metal connection between the switched capacitor array 20 and the inductor IN may induce an additional current loop and thus degrade an aggressor to the inductor coupling. By merging the inductor IN with the connecting parts 22, 24 of the switched capacitor array 20, the undesired current loop can be avoided.

According to an embodiment, likewise, the conductor 210 is shaped for forming a first loop L1 and a second loop L2 of the inductor IN. A first crossing C1 is present between the first loop L1 and the second loop L2. The first loop L1 encloses a first area and the second loop L2 encloses a second area. The first loop L1 is generally defined by the conductor 210 and the first crossing C1, which makes the first enclosed area. The second loop L2 is generally defined by the conductor 210, the first crossing C1, and the connecting parts 22, 24 of the switched capacitor array 20. According to an embodiment, the first loop L1 is asymmetric to the second loop L2 with respect to the axis AS. According to an embodiment, the first enclosed area is smaller than the second enclosed area. According to an embodiment, the second loop L2 is disposed closer to the switched capacitor array 20 and the first loop L1 is disposed farther away from the switched capacitor array 20.

According to an embodiment, the conductor 210 is further shaped for forming a third loop L3 and a fourth loop L4. According to an embodiment, a third crossing C3 of the conductor 210 with itself is present between the third loop L3 and the fourth loop L4. According to an embodiment, the third loop L3 and the fourth loop L4 define a third enclosed area and a fourth enclosed area, respectively. According to an embodiment, the fourth enclosed area is greater than the third enclosed area.

According to an embodiment, the conductor 210 is further provided with a fourth crossing C4 with itself connecting the first loop L1 with the third loop L3 thereby further defining the boundaries of the first enclosed area and the third enclosed area.

According to an embodiment, the first loop L1 is connected between the fourth loop L4 and the second loop L2. According to an embodiment, the fourth loop L4 is connected between the first loop L1 and the third loop L3 to obtain an 8-shaped structure in series with an 8-shaped structure.

According to an embodiment, the third loop L3 is arranged within the first loop L1 and the fourth loop L4 is arranged within the second loop L2 thereby forming a fifth crossing C5 for further defining the fourth enclosed area, and forming a sixth crossing C6 for further defining the first and second enclosed area, to obtain an 8-within-8 shaped structure.

The inductor IN may be fabricated on the substrate 100 by conventional semiconductor fabrication processes including but not limited to deposition, lithography, etching, cleaning, polishing, annealing or the like. The inductor IN may be composed of at least two interconnect layers. Generally, the thicker top interconnect layer has lower resistance and the inductor IN is generally laid out in the top metal layers, except for the locations where the conductor 210 crosses itself. At those crossings the lower interconnect layer is used. For example, in FIG. 6, the conductor 210 is located in the top metal layers and connected to underlying interconnect layers 211, 213, 214, 215 at the crossings C1, C3, C4, C5-C6, respectively. The interconnect layers 211, 214, and 215 may be located in the lower metal layer below the top metal layers. The interconnect layers 213 may be located in the metal layer below the interconnect layers 211, 214, and 215.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
a substrate;
a first terminal and a second terminal; and
a conductor arranged on the substrate between the first terminal and the second terminal to constitute an inductor shaped for forming a first loop and a second loop, wherein a first crossing of the conductor with itself is present between the first loop and the second loop, wherein the first loop and the second loop define a first enclosed area and a second enclosed area, respectively, and wherein the first enclosed area is smaller than the second enclosed area, wherein the conductor is provided with a second crossing with itself between the terminals and the second loop.

2. The semiconductor device according to claim 1, wherein the first terminal and a second terminal are two terminals of a switched capacitor array.

3. The semiconductor device according to claim 2, wherein the second loop is disposed closer to the switched capacitor array and the first loop is disposed farther away from the switched capacitor array.

4. The semiconductor device according to claim 1, wherein the inductor is at least partially surrounded by a ground metal ring.

5. The semiconductor device according to claim 4, wherein the ground metal ring is constructed at a top metal layer over the substrate.

6. The semiconductor device according to claim 1, wherein the conductor is further shaped for forming a third loop and a fourth loop, wherein a third crossing of the conductor with itself is present between the third loop and the fourth loop, and wherein the third loop and the fourth loop define a third enclosed area and a fourth enclosed area, respectively, and wherein the fourth enclosed area is greater than the third enclosed area.

7. The semiconductor device according to claim 6, wherein the conductor is further provided with a fourth crossing with itself connecting the first loop with the third loop thereby further defining the boundaries of the first enclosed area and the third enclosed area.

8. The semiconductor device according to claim 7, wherein the first loop is connected between the fourth loop and the second loop, the fourth loop is connected between the first loop and the third loop to obtain an 8-shaped structure in series with an 8-shaped structure.

9. The semiconductor device according to claim 8, wherein the third loop is arranged within the first loop and the fourth loop is arranged within the second loop thereby forming a fifth crossing for further defining the fourth enclosed area, and forming a sixth crossing for further defining the first and second enclosed area, to obtain an 8-within-8 shaped structure.

10. The semiconductor device according to claim 1, wherein the inductor is part of an inductor-capacitor voltage-controlled oscillator.

11. An inductor device, comprising:
a substrate;
a first terminal and a second terminal;
a conductor arranged on the substrate between the first terminal and the second terminal to constitute an inductor shaped for forming a first loop and a second loop, wherein a first crossing of the conductor with itself is present between the first loop and the second loop, wherein the first loop and the second loop define a first enclosed area and a second enclosed area, respectively, and wherein the first enclosed area is smaller than the second enclosed area; and
a switched capacitor array comprising a connecting part, wherein the connecting part is merged with the second loop.

12. The inductor device according to claim 11, wherein the first terminal and a second terminal are two terminals connected to a switched capacitor array.

13. The inductor device according to claim 12, wherein the second loop is disposed closer to the switched capacitor array and the first loop is disposed farther away from the switched capacitor array.

14. The inductor device according to claim 11, further comprising a ground metal ring, wherein the ground metal ring partially surrounded the conductor.

15. The inductor device according to claim 14, wherein the ground metal ring is constructed at a top metal layer over the substrate.

16. The inductor device according to claim 11, wherein the conductor is provided with a second crossing with itself between the terminals and the second loop.

17. The inductor device according to claim 16, wherein the conductor is further shaped for forming a third loop and a fourth loop, wherein a third crossing of the conductor with itself is present between the third loop and the fourth loop, and wherein the third loop and the fourth loop define a third enclosed area and a fourth enclosed area, respectively, and wherein the fourth enclosed area is greater than the third enclosed area.

18. The inductor device according to claim 17, wherein the conductor is further provided with a fourth crossing with itself connecting the first loop with the third loop thereby further defining the boundaries of the first enclosed area and the third enclosed area.

19. The inductor device according to claim 18, wherein the first loop is connected between the fourth loop and the second loop, the fourth loop is connected between the first loop and the third loop to obtain an 8-shaped structure in series with an 8-shaped structure.

20. The inductor device according to claim 19, wherein the third loop is arranged within the first loop and the fourth loop is arranged within the second loop thereby forming a fifth crossing for further defining the fourth enclosed area, and forming a sixth crossing for further defining the first and second enclosed area, to obtain an 8-within-8 shaped structure.

* * * * *